United States Patent [19]

Cruz

[11] Patent Number: 5,183,370
[45] Date of Patent: Feb. 2, 1993

[54] APPARATUS FOR PLACING OR STORING FLAT ARTICLES IN A CASSETTE WITH INTERMEDIATE RACKS

[75] Inventor: Didier Cruz, Grenoble, France

[73] Assignee: Commissariat a l'Energie Atomique, Paris, France

[21] Appl. No.: 628,487

[22] Filed: Dec. 17, 1990

[30] Foreign Application Priority Data

Dec. 29, 1989 [FR] France .................. 89 17450

[51] Int. Cl.⁵ .............................................. B65G 65/23
[52] U.S. Cl. ..................................... 414/416; 414/277; 414/281; 414/331; 414/752
[58] Field of Search ............... 414/225, 277, 281, 331, 414/392, 416, 662, 752

[56] References Cited

U.S. PATENT DOCUMENTS

| | | |
|---|---|---|
| 4,178,113 | 12/1979 | Beaver, II et al. |
| 4,493,606 | 1/1985 | Foulke et al. ............... 414/416 X |
| 4,550,242 | 10/1985 | Uehara et al. |
| 4,759,681 | 7/1988 | Nogami . |
| 4,938,655 | 7/1990 | Asano ............................ 414/416 X |
| 4,988,252 | 1/1991 | Yamamoto et al. ................ 414/331 |

FOREIGN PATENT DOCUMENTS

| | | |
|---|---|---|
| 0250990 | 1/1988 | European Pat. Off. . |
| 3442161 | 5/1986 | Fed. Rep. of Germany ...... 414/392 |
| 2314811 | 1/1977 | France . |

Primary Examiner—D. Glenn Dayoan
Assistant Examiner—Tuan N. Nguyen
Attorney, Agent, or Firm—Pearne, Gordon, McCoy & Granger

[57] ABSTRACT

An apparatus which makes it possible to store or place flat articles (20) in a storage cassette (18) with the aid of an intermediate cassette (60), so that it is possible to temporarily store in the latter certain flat articles (20). The apparatus includes a gripping device (50) having a number of tracks (2) corresponding to the number of racks of the storage cassette (18). It also includes an intermediate cassette (60), whereof each rack is placed so as to correspond with the tracks (2) of the gripping device. In order to insert or remove a flat article (20) with respect to the storage cassete (18), it is possible to remove certain flat articles (21) from the gripping device (50) which might cause a hindrance during the penetration of the tracks (2) into the storage cassette (18). A pneumatic raising device is responsible for the handling of the flat articles on the tracks (2). Specific application to the handling of silicon wafers used in the manufacture of integrated circuits.

10 Claims, 6 Drawing Sheets

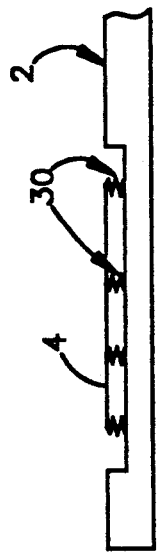
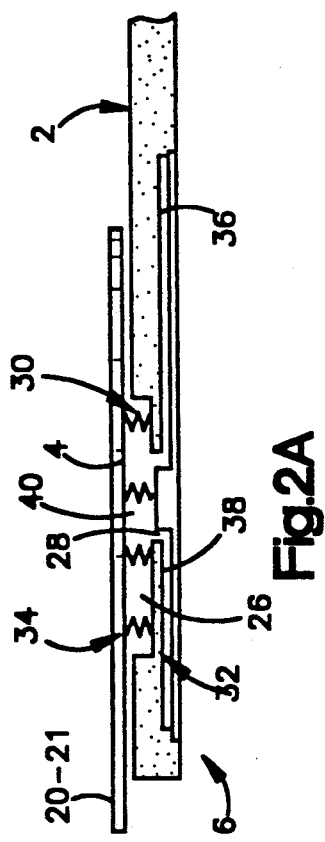
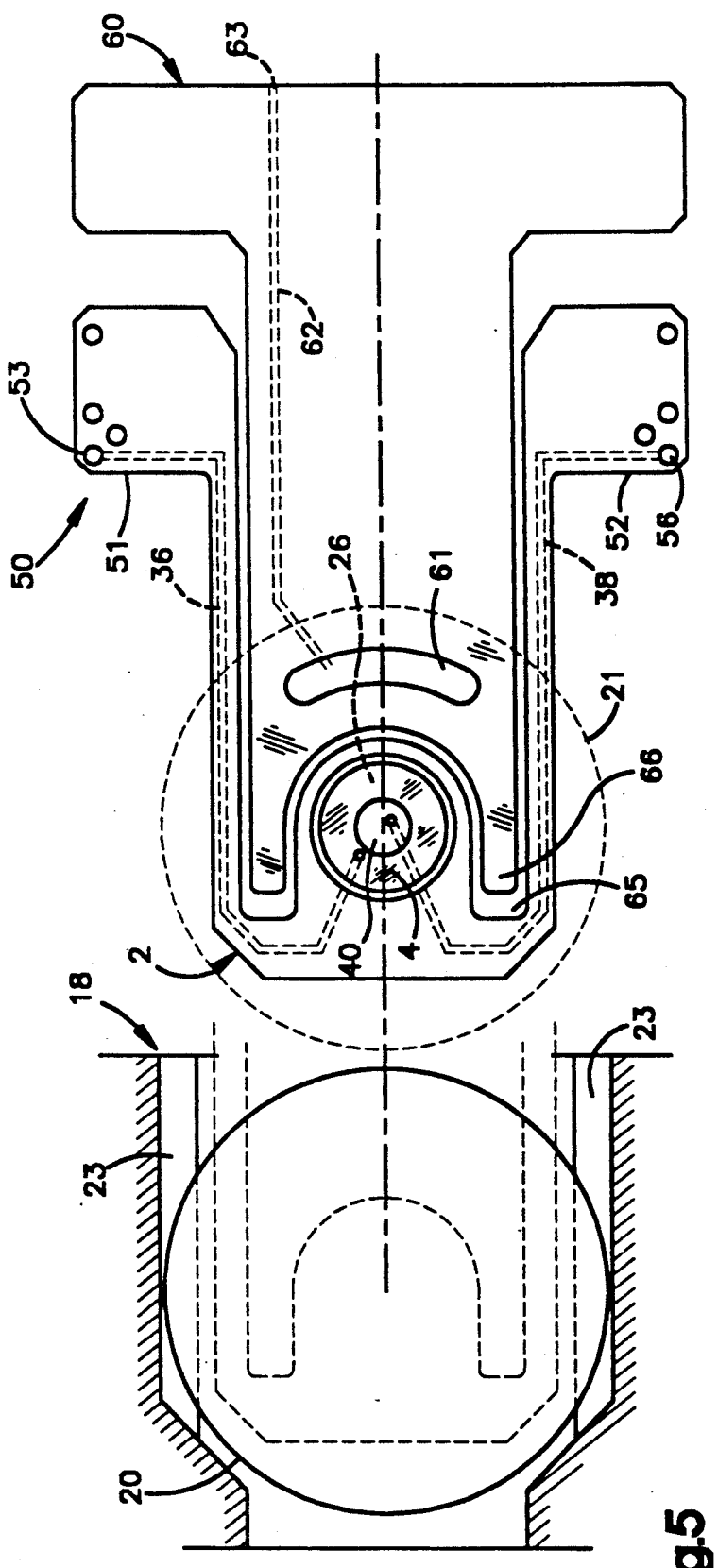

APPARATUS FOR PLACING OR STORING FLAT ARTICLES IN A CASSETTE WITH INTERMEDIATE RACKS

BACKGROUND OF THE INVENTION

1. Field of the Invention

The field of the invention is that of handling flat articles to be placed in or removed from a cassette. This is particularly the case during the manufacture of integrated circuits, where silicon wafers are manipulated and positioned in cassettes and then are extracted from the cassettes to undergo other production operations.

Description of the Related Art

For the production of integrated circuits on silicon wafers, the control and handling of the wafers must take place from storage cassettes in which they are horizontally positioned. Each cassette has a series of racks constituted by lateral supports which can horizontally receive a series of wafers having identical dimensions. The handling of the wafers imposes the use of a system making it possible to take up a wafer stored in a cassette and then place the wafer in any random cassette on any random free rack.

In order to carry out these operations of gripping and putting back into place a wafer with respect to a cassette, it is known to use a gripping mechanism essentially constituted by a gripping finger able to remove a single wafer from the cassette and then to put it back into the latter. Due to the very limited height space separating two adjacent wafers, which is approximately 5 mm for the "SEMI-ENGINEERING" standard, the movements of the gripping finger must be very precise. Thus, any gripping system must be able to penetrate beneath the wafer to be removed without scratching the upper wafer. The height positioning of the gripping finger is ensured by a very precise, but onerous mechanical device, moving the finger and its support vertically. The gripping finger can also remain fixed, the precise vertical translation movement then being carried out by another mechanical device moving the cassette. In the latter case, it is the precision of the cassette translation mechanism which is very expensive.

SUMMARY OF THE INVENTION

A first aim of the invention is to provide a device for gripping and releasing a wafer with respect to a cassette and which is able to penetrate between the racks of said cassette without any difficulty. In addition, the handling or manipulation of this device must be easy, and the cost reduced, compared with the aforementioned known gripping device.

A second aim of the invention is to be able to simultaneously carry out the gripping of one or more wafers in the cassette at different stages and the placing of other wafers in the cassette at different stages without there being any interference on the same stage.

To this end, the main object of the invention is an apparatus for arranging flat articles stored in a storage cassette in a parallel manner and placed on racks constituted by lateral supports, which have a clearly defined number N and which are separated from one another by a defined clearance E.

According to the invention, the apparatus comprises a gripping means having the same number N of horizontal tracks, which are separated from one another by the same predetermined clearance E and each gripping means is terminated by a gripping end, where are located the gripping and release means for a flat article with respect to a corresponding rack of the cassette; an intermediate cassette having a second predetermined number M, equal to or greater than the first number N of racks, which are spaced from one another by the clearance E, in order to temporarily receive the flat articles; and relative, horizontal translation means between the gripping means and the intermediate cassette, in order to permit the transfer in both directions of at least one flat article between the gripping means and the intermediate cassette, which makes it possible to temporarily store flat articles located on the gripping means, so that no interference is caused at their rack, with flat articles placed in the storage cassette on the corresponding rack.

A preferred construction of the means for gripping and releasing flat articles according to the invention provides for the gripping of a flat article to take place by raising a mobile part of the track and the release of the flat article takes place by the lowering of the same mobile part of the track.

According to the preferred construction of the gripping means, each is constituted by a deformable bellows, which is fixed to the track by a first lower end and to the mobile part by a second upper end. The bellows is also connected to a vacuum source.

According to a feature of the invention, each rack of the intermediate cassette is constituted by two lateral supports leaving a space between them to permit the interpenetration of the corresponding track of the gripping means by translation parallel to the lateral supports, the upper surface of the mobile track being located slightly below the upper surface of the lateral supports of the corresponding stage of the intermediate cassette. The vertical travel of the mobile track during a rising process must be adequate to bring about a disengagement of a flat article placed on the lateral supports of the intermediate cassette and, during the lowering of the mobile track again, permits a deposition of the flat article on the lateral supports of the intermediate cassette.

In a preferred manner, the apparatus is completed by selective control means for actuating independently of one another the gripping and release means, so that they can seize or put back into place any random flat article placed in the storage cassette, or the intermediate cassette, or located on a track.

In the main embodiment the interpenetration of the gripping means into the intermediate cassette takes place by recesses formed at the rear of each of the tracks of the gripping means, enabling the intermediate cassette to reach the mobile track from the rear. In this case, means for the vertical translation of the intermediate cassette are provided, so that a displaced correspondence is brought about between the respective racks of the intermediate cassette and the gripping means.

In a constructional variant, the interpenetration of the gripping means into the intermediate cassette takes place from the front of the tracks, whose width is less than the width of the free space between the lateral supports of the storage cassette and the lateral supports of the intermediate cassette, so as to traverse these two cassettes in the same translation movement. In this case, means for the vertical translation of the gripping means are provided in order to bring about a displaced correspondence between the respective racks of the intermediate cassette and the gripping means.

BRIEF DESCRIPTION OF THE DRAWINGS

The invention is described in greater detail hereinafter relative to non-limitative embodiments and the attached drawings, wherein:

FIGS. 2A and 2B, are two side views of the end of a track used in the apparatus according to the invention and equipped with gripping means;

FIG. 5 is a perspective view of a first embodiment of the apparatus according to the invention positioned facing a storage cassette;

DETAILED DESCRIPTION OF THE PREFERRED EMBODIMENTS

Figure 1A:
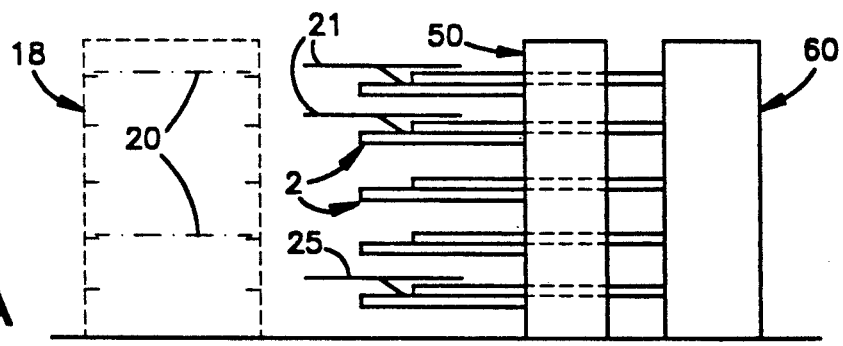
FIGS. 1A,1B,1C,1D and 1E are operating diagrams of the apparatus according to the invention.

One of the problems solved by the invention is revealed in FIG. 1A. To the right of the drawing is shown the apparatus according to the invention in a first embodiment. To the left of the drawing is provided a storage cassette 18 containing flat articles 20, such as silicon wafers, to be used in the manufacture of integrated circuits in microelectronics.

The apparatus according to the invention makes it possible to place or store flat articles 20,21,22,25 in the storage cassette 18. The term store is used in the broad sense of placing flat articles in the storage cassette 18, and also for the action of removing the cassettes therefrom, in order to place them in another storage cassette, or even to place them on a different rack.

It can be gathered from FIG. 1A, that if it is desirable to place within the storage cassette 18 the second and fifth flat articles 22,25, respectively placed on the second and fifth tracks 2 of the apparatus according to the invention, said operation is rendered impossible. Thus, the first track of the apparatus and the first rack of the storage cassette 18 are both occupied by a flat article. An attempted penetration of the second and fifth flat articles 22,25 into the storage cassette 18 at the corresponding rack would inevitably lead to a telescoping of the first flat article 21 of the apparatus with the flat article placed on the first rack of the storage cassette 18.

According to the invention, an intermediate cassette 60 is available which has a number of tracks 60, which are at least equal in number to the number of tracks 2 of the gripping means 50. Each intermediate track 62 of the intermediate cassette 60 is arranged in corresponding manner with a track 2 of the gripping means 50. These two groups of tracks 2 and 62 can be positioned very close to one another. The function of the intermediate track 62 is to temporarily receive one or more flat articles and, in the present case, the flat article 21 placed on the first rack so that the gripping means 50 can place the second and fifth flat articles 22,25 in the storage cassette 18 at their respective rack.

Figure 1B:
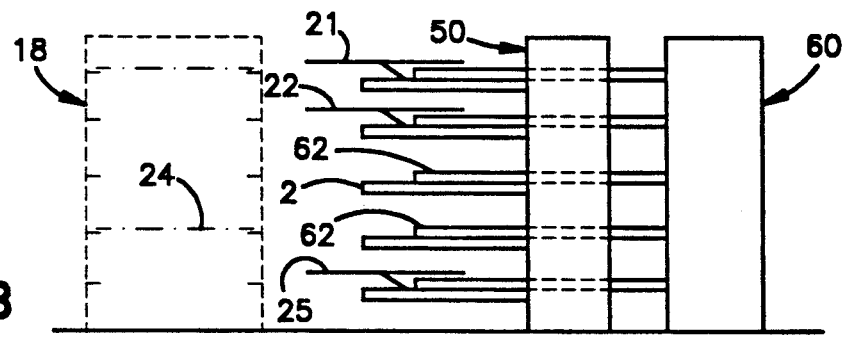

The operation shown in FIG. 1B consists of depositing the first flat article 21 on the corresponding intermediate rack. To this end and for carrying out the manipulations in the storage cassette 18, each track 2 has means for gripping and releasing a flat article.

In the construction described here, the said gripping and release means operate while maintaining in a raised position the flat articles 22,25 to be placed in the storage cassette 18, while lowering the flat article 21 which is to be deposited on the corresponding intermediate rack. The constructional details of said gripping and release means will be explained hereinafter relative to FIGS. 2A and 2B.

Figure 1C:
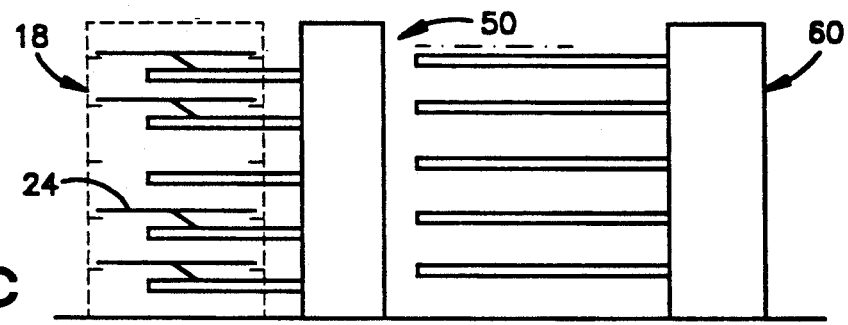

Once the flat article 21 has been placed on the corresponding intermediate rack of the intermediate cassette 60, the gripping means 50 can then penetrate or enter the storage cassette 18. This takes place in such a way that the two flat articles 22,25 to be deposited in the storage cassette 18 are located just above their respective storage rack of the storage cassette 18 in the manner shown in FIG. 1C.

Figure 1D:
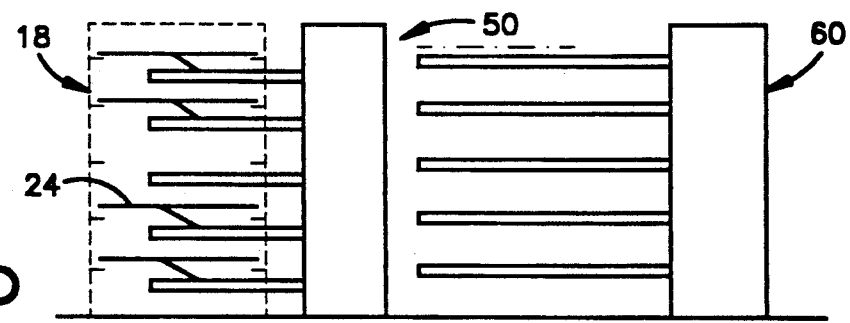

FIG. 1D shows the second and fifth flat articles 22,25 placed on their storage rack. It also shows the gripping and release means for the fourth track of the gripping means when raising an article 24, which was previously stored in the storage cassette 18.

Figure 1E:
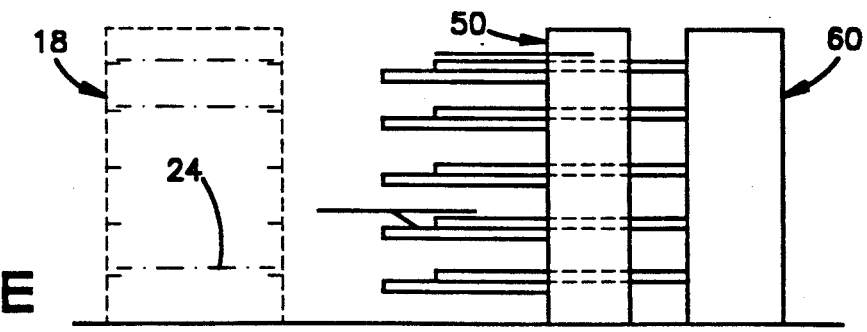

Finally, FIG. 1E shows the gripping means passed out of the storage cassette 18 with the fourth flat article 24. The second and fifth flat articles 22, 25 are then arranged in the storage cassette 18.

With reference to FIGS. 2A and 2B, the gripping and release means can be constructed in the form of a pneumatic bellows 30 raising or lowering a mobile part 4 of the track 2. The latter is placed at the end 6 of each track 2 of the gripping means below the mobile part 4. The lower end 32 of the bellows 30 is fixed to the track 2. The upper end 34 of the bellows 30 is fixed to the mobile part 4. The interior of the bellows 30 is connected, by a first pipe 36 within the track 2, to pressurizing means (not shown).

The pressurizing of a main chamber 26 of the bellows 30 leads to the raising of the upper end 34 thereof and to a raising of a flat article 20, when the apparatus is placed just below such an article 20. The return to ambient pressure of the bellows 30 leads to the lowering again by gravity of the upper end 34 of the bellows 30 and, consequently, to the lowering again of the article 20. When the lowering takes place above the lateral supports 23 of a cassette 18, the flat article is placed on the lateral supports 23.

Each mobile part 4 of the tracks 2 is provided with an orifice 40 issuing onto the upper surface of the mobile part 4. It is connected by a central chamber 28 and a second pipe 38 to vacuum means, which are not shown in the drawings.

When there is a vacuum in the pipe 38 and the orifice 40, a suction phenomenon appears on the upper surface of the mobile part 4 and creates a retention force on the flat article 20 placed on said upper surface of the mobile part 4. This makes it possible to secure the flat article 20 during the various manipulations of the apparatus. This arrangement is not indispensable to the operation of the apparatus.

In order to be usable in cassettes, where the height clearance between the different racks is very small, it is necessary for the bellows 30 to be flattenable or collapsible in the lower position, so that it can be housed in the thickness of the track. This permits the insertion of the track 2 between two adjacent flat articles located within the storage cassette.

Figure 3:
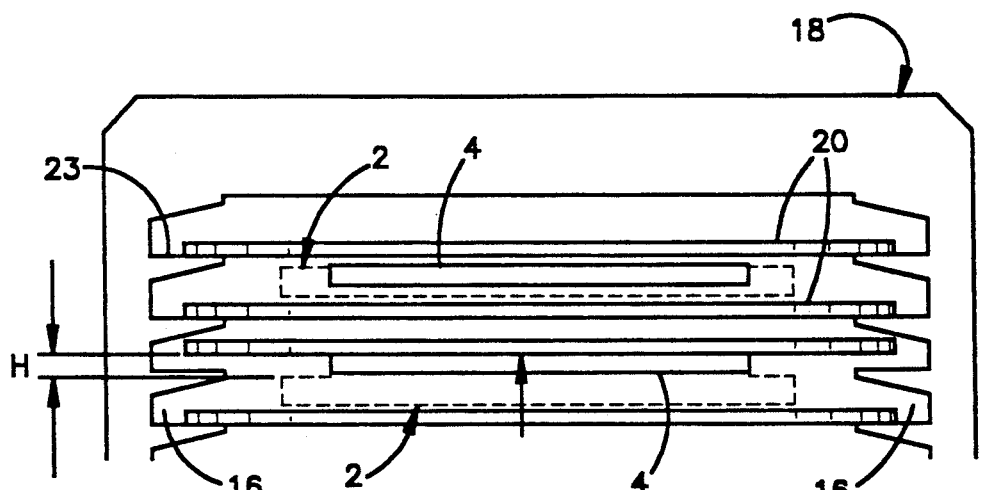
FIG. 3 is a front sectional view of a storage cassette in which are stored flat articles and between which is inserted the apparatus according to the invention.
Figure 4:
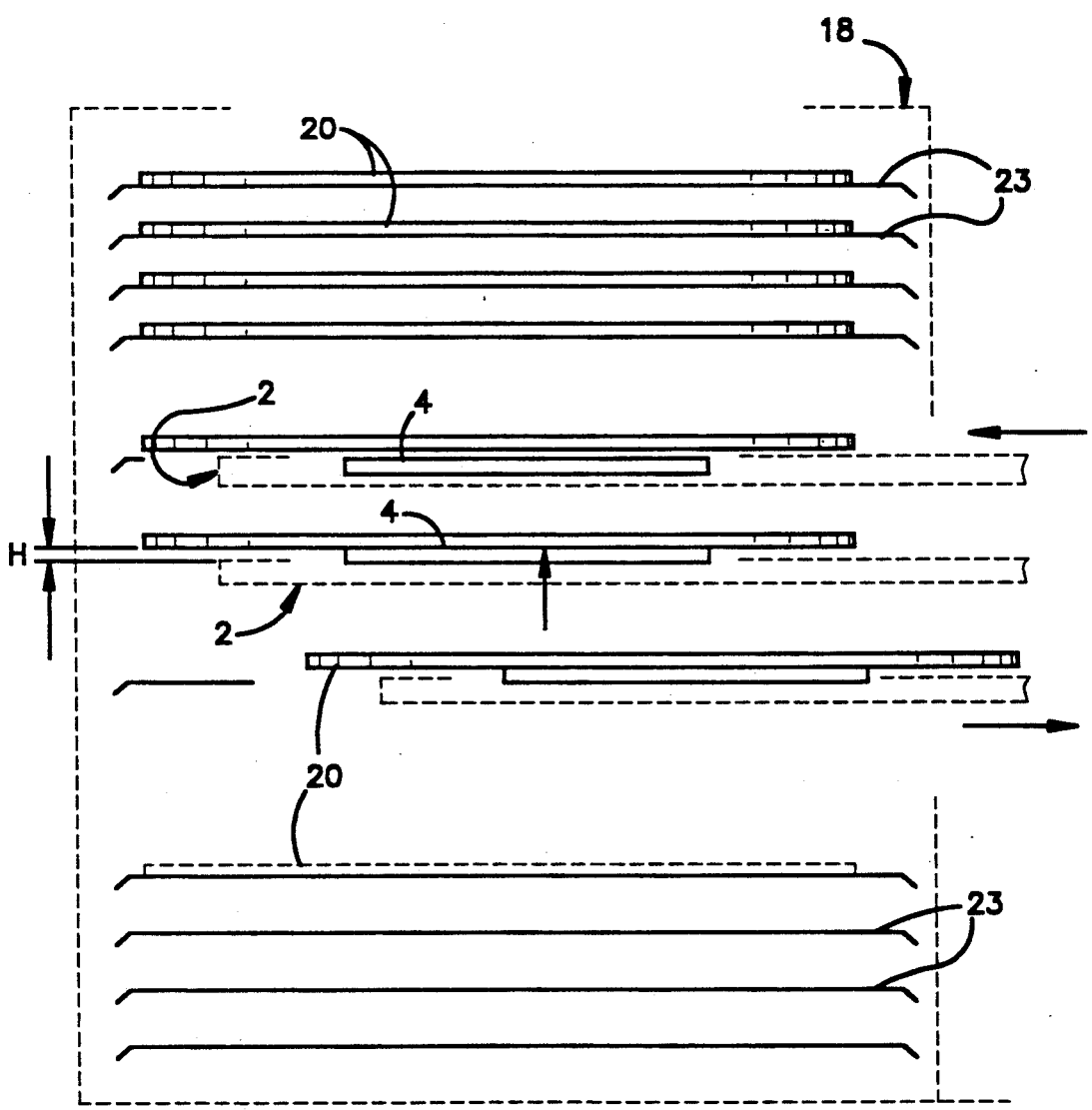
FIG. 4 is a lateral sectional view showing three phases of the gripping of a flat article in the storage cassette using the apparatus according to the invention.

It is possible to see the efficiency and reliability of the apparatus according to the invention and in particular its gripping means on considering FIGS. 3 and 4.

Flat articles 20 are shown placed on a storage cassette 18. The scale of these drawings is of the same order of magnitude as the constructions used. It can be seen that the width of the track 2 is less than the clearance between the inner wall 16 of the storage cassette 18, so as to permit insertion into the latter. Preferably, the width of the track is smaller than the space defined by the ends of the lateral supports 23, so as to permit an insertion of the tracks 2 into the storage cassette 18, even if these tracks are not at the adequate height, i.e. facing a pair of lateral supports 23.

However, in order to load or unload one or more flat articles 20 with respect to the storage cassette 18, it is necessary to introduce the tracks 2 in such a way that their upper surfaces are on planes located just below those defined by the upper surfaces of the lateral supports 23, which carry the articles to be seized, or on which are to be placed the said articles. The vertical displacement H of the mobile part 4 of each track 2 must be adequate to permit a disengagement of each flat article 20 with respect to the lateral supports 23 in the case of unloading and for putting it back into place in the case of loading. In both cases, very accurate height positioning of the tracks 2 relative to the storage cassette 18 is necessary.

In FIG. 4 the arrow directed to the left symbolizes the insertion of a track 2 beneath a flat article 20, the mobile part 4 of the track 2 being in the rest position. Just below it is shown the operation of raising the mobile part 4 by a vertical movement thereof by a predetermined value H. The latter must exceed the initial height difference between the upper surface of the mobile part 4 and the upper surfaces of the lateral supports 23. Below it is shown a lateral displacement to the right of the track 2 supporting the flat article 20, in order to extract the latter from the cassette.

FIG. 5 is a sectional plan view of the apparatus according to the invention on the right side of the drawing and of the storage cassette on the left side of the drawing. The latter is shown with its racks, each constituted by two lateral supports 23, on which is placed a flat article 20, in the present case a silicon wafer. On the right-hand side of the drawing, another flat article 21 is placed on a track 2 of the gripping means 50 centered on the mobile part 4 of said track 2. A track of the intermediate cassette 60 penetrates the gripping means 50 via two lateral arms 66 entering recesses 65 in the track 2.

The forms shown in FIG. 5 constitute a preferred embodiment of the interpenetration of the gripping means 50 and the intermediate cassette 60, but said forms are in no way limitative. Other forms can be used, the only essential constraint regarding these shapes is that the flat article 21 can rest, via a simple vertical translation, either on the mobile part 4 of the track 2, or on the two lateral arms 66 or other parts of the track of the intermediate cassette 60. The pipe 36 of the track 2 can also be in any random form, the essence being that it leads to the central cavity 40 of the bellows placed beneath the mobile part 4. Said pipe 36 is connected to a vacuum source 53, which can be located in one of the two side walls 51 of the gripping means 50.

In an identical manner, an orifice 61 can be made in that part of the track of the intermediate cassette 60 located beneath the flat article 21, so as to be able to apply a suction to the latter to hold it in place during possible transfers of the apparatus according to the invention. This orifice 61 is connected by a pipe 62 to another vacuum source 63, which can be placed in the central body of the intermediate cassette 60.

Figure 6:
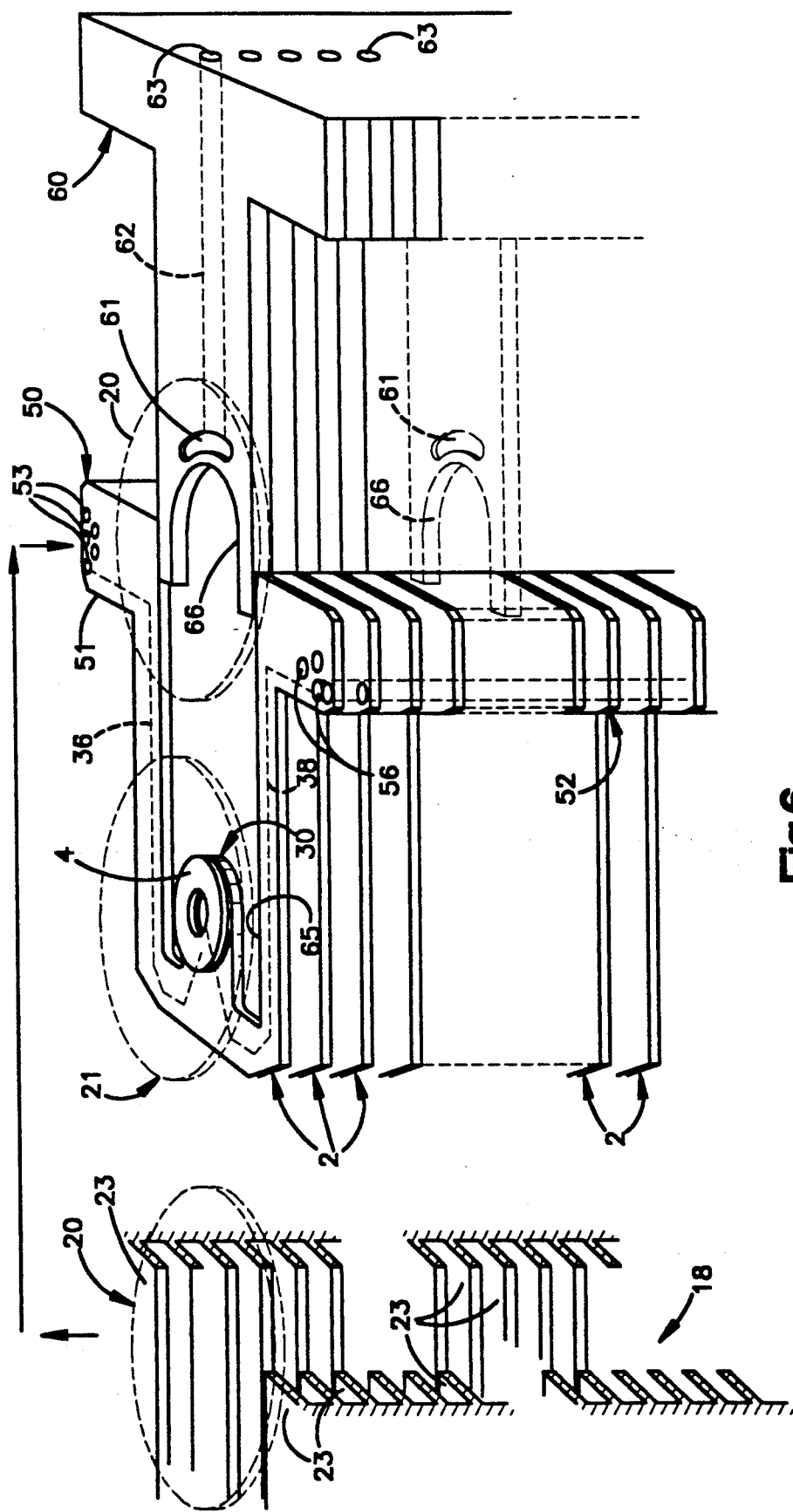
FIG. 6 is a perspective diagram of the apparatus according to the invention.

FIG. 6 provides a better understanding of the form which can be assumed by the gripping means 50. On the first track 2 is shown the bellows 30 supporting the mobile part 4, on which can be placed the first flat article. The recesses 65 separate the center of the track 2 from the side walls 51,52 of the gripping means. It can be seen that there must be a space 57 between these two side walls 51,52, to allow the tracks of the intermediate cassette 60 to penetrate the recesses 65. The rigidity of the system is ensured by the side walls 51,52. The width of the tracks 2 is smaller than the width of the free space between the lateral supports of the storage cassettes.

The side walls 51,52 of the gripping means 50 house ducts 53,56 which are connected to vacuum sources. The latter are controlled by selective control means of the different racks of the gripping means 50 and which are located within the latter. This makes it possible to independently actuate the mobile parts 4 of the tracks 2 in order to seize or set down any random article placed in the storage cassette 18, or the intermediate cassette 60, or placed on a track 2.

As illustrated by FIG. 6, the gripping means 50 and the intermediate cassette 60 are in each case preferably constituted by a stack of N or M stages. This provides a better understanding of the modular construction of these two systems, which is an important advantage in connection with their manufacture. It is therefore easy to manufacture different gripping systems or intermediate cassettes having a different number of stages on each occasion.

Figure 7A:
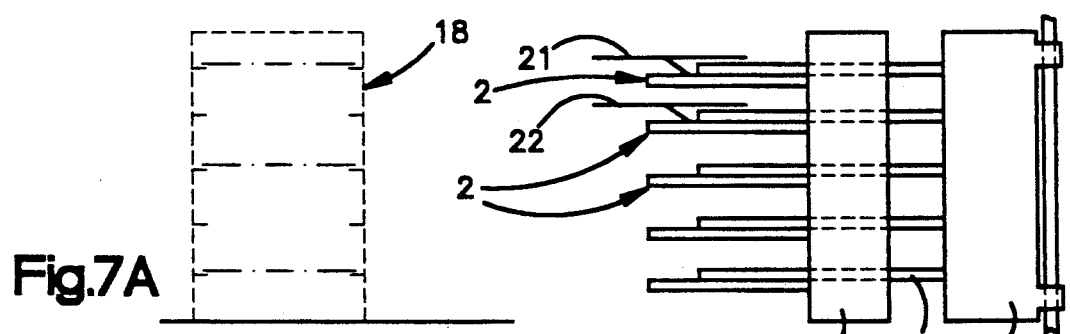
FIGS. 7A,7B,7C and 7D are diagrams showing the operation and use of the apparatus according to the invention equipped with an improvement.
Figure 7B:
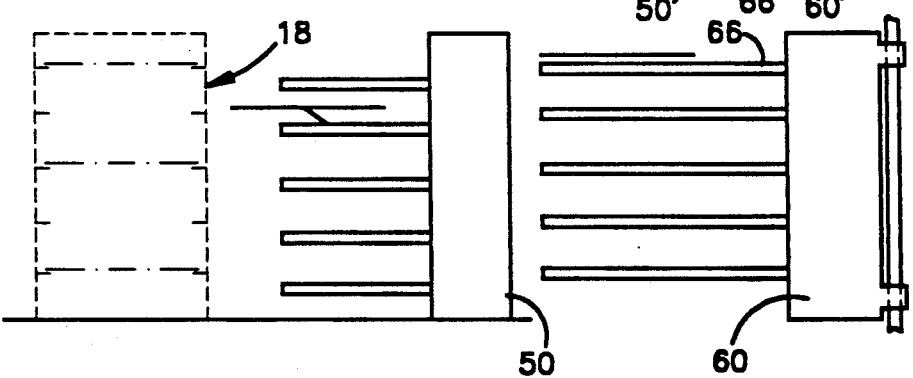
Figure 7C:
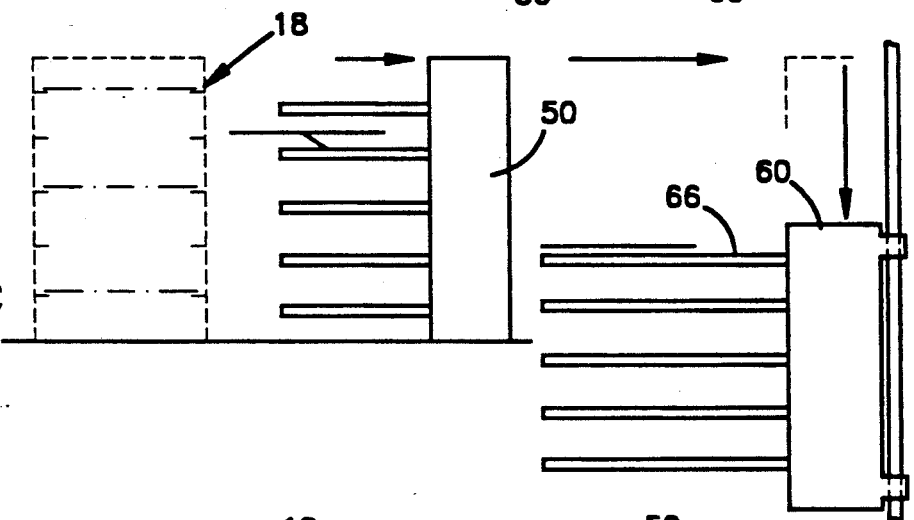
Figure 7D:
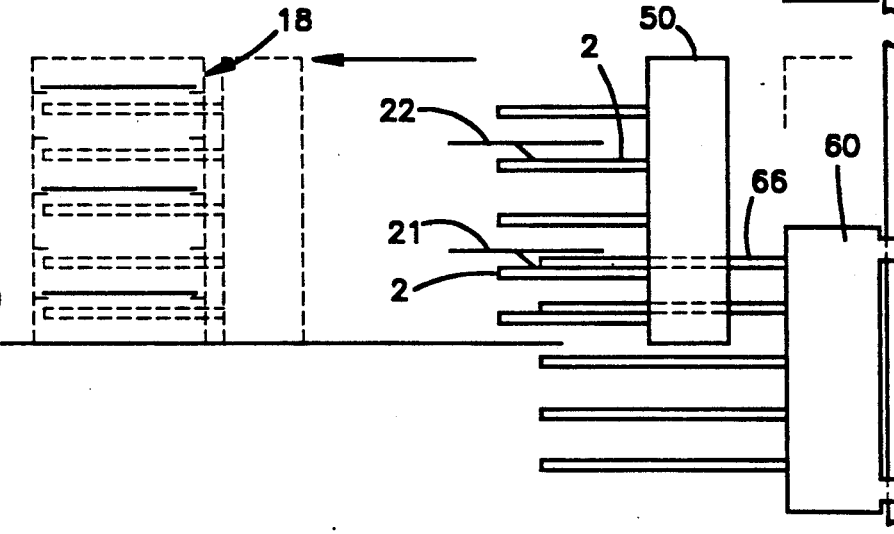
Figure 8A:
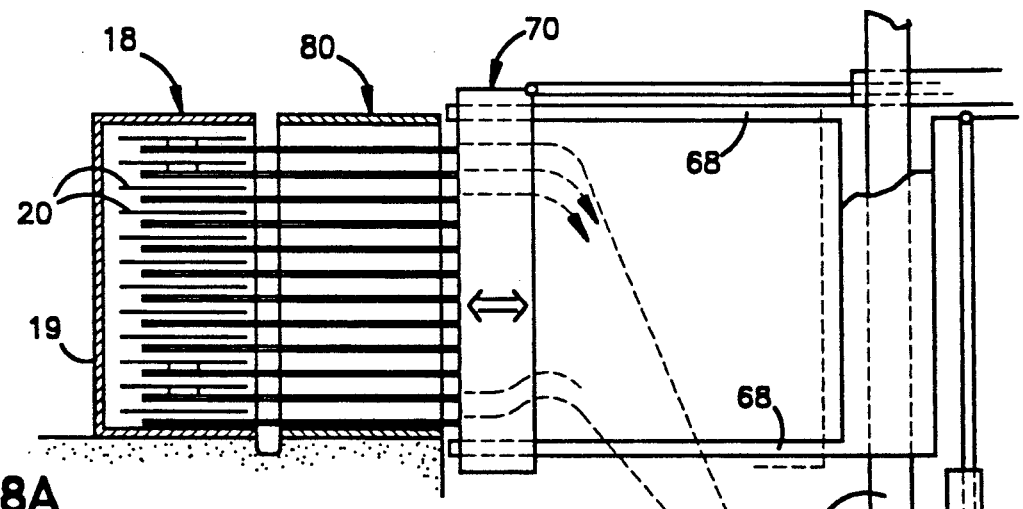
FIGS. 8A,8B and 8C are side views of a constructional variant of the apparatus according to the invention, adapted to the principle illustrated by FIGS. 7A,7B,7C and 7D.
Figure 8B:
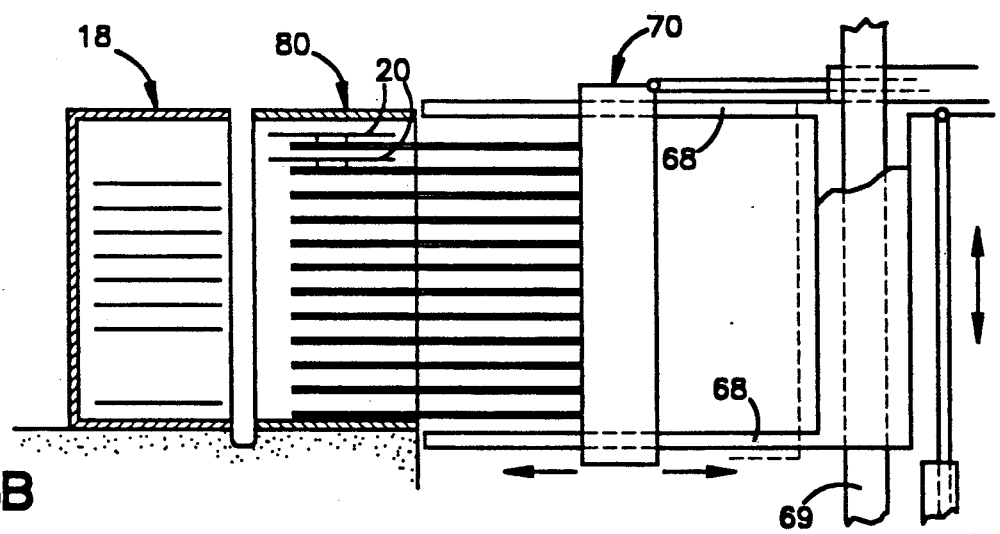
Figure 8C:
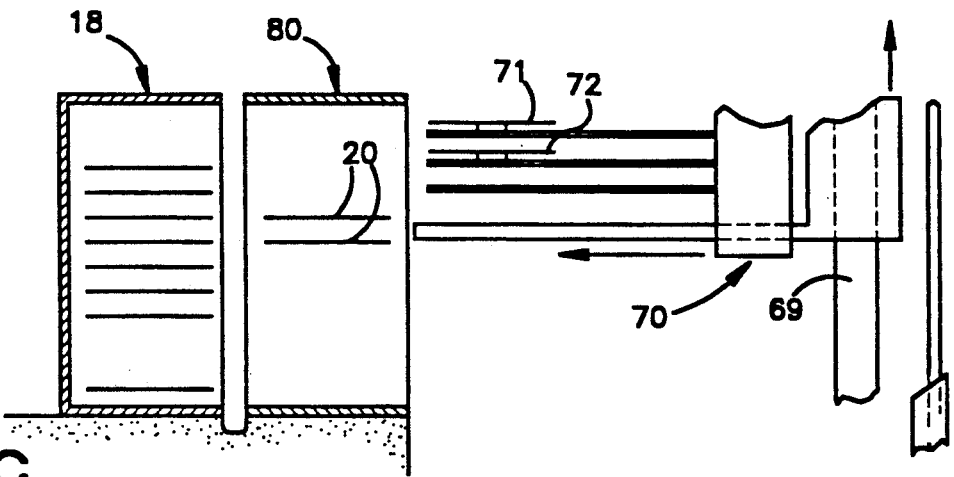

The apparatus according to the invention can be completed by vertical translation means applied to the intermediate cassette and as illustrated by FIGS. 7A,7B,7C and 7D, or applied to the gripping means as illustrated by FIGS. 8A,8B and 8C.

Thus, it may be necessary to manipulate the flat articles during their arrangement or storage, so as to change their position within the storage cassette 18. Such an operation can be likened to that of shuffling a pack of playing cards.

FIG. 7A shows the problem which can be solved by such an apparatus. An article 21 placed on the gripping means 50 and more specifically on the first rack can, during a manipulation of the apparatus, interfere with the flat article 20 placed on the first rack of the storage cassette 18. Thus, if it is desired to place the flat article 22 in the storage cassette 18, there would be a telescoping action of the articles 20,21 placed on the first racks.

FIG. 7B shows the second flat article 22, raised by the mobile part of the second track 2, the first flat article 21 continuing to rest on the lateral arm 66 of the first rack of the intermediate cassette 60. The gripping means 50 is then advanced, in such a way that there is no longer any interpenetration of the intermediate cassette 60 in the gripping means 50.

The intermediate cassette 60 is mounted on vertical translation means represented by two sliding bearings 67. Consequently, and as illustrated by FIG. 7C, the intermediate cassette 60 can be lowered again by a predetermined amount. It is then possible to position the first flat article 21 facing a free rack of the gripping means 50, in front of which the corresponding rack of the cassette 18 remains free, in the present case the fourth rack.

The sequence of operations consists of retracting the gripping means 50 in order to obtain a new interpenetration thereof with the cassette 60. As shown in FIG. 7D, once this operation has been carried out and with the first article 21 level with the fourth rack of the gripping means 50, said article can be raised by the mobile part of the fourth track 2.

The final, not shown, operation consists of placing the flat article 21 on the fourth rack of the intermediate cassette 18, while permitting the placing of the second flat article 22 in the second rack of the intermediate cassette 18. It is also possible to remove the first, third and fifth flat articles stored in the storage cassette 18.

FIGS. 8A, 8B and 8C show a second embodiment of the apparatus according to the invention when using vertical translation means. According to this embodiment the intermediate cassette 80 is placed in front of the gripping means 70. Therefore, the latter is connected to vertical translation means. The gripping means 70 is mounted so as to slide in horizontal translation on support arm 68 which is mounted in a sliding manner on the vertical translation shaft 69.

In this embodiment, the tracks 2 have an adequate length to be able to penetrate the interior of the storage cassette 18 after traversing the intermediate cassette 80. The latter is constituted by superimposed racks maintained in place by a peripheral frame similar to that of the storage cassette 18, but without its bottom 19.

As illustrated by FIGS. 8A, 8B and 8C, the intermediate cassette 80 can be permanently positioned in front of the storage cassette 18.

FIG. 8A shows the removal of the first, second, tenth and eleventh flat articles 20 stored in the storage cassette 18 and which takes place by raising the bellows carrying the mobile part of each track 2.

FIG. 8B shows the deposition of the tenth and eleventh flat articles 71, 72 in the intermediate cassette 80 and illustrated by the fact that their respective bellows are folded back.

These tenth and eleventh articles 71, 72 can therefore be placed on the corresponding racks of the intermediate cassette 80.

On continuing the withdrawal movement of the gripping means 70 and on lowering the latter, it is possible to again place the first and second flat articles 20 on free racks of the intermediate cassette 80 and differing from the first and second racks. The passage towards the first and second racks of the storage cassette 18 is then free.

As illustrated by FIG. 8C, raising of the gripping means 70 makes it possible to position the tenth and eleventh flat articles 71, 72 in front of the first and second racks of the storage cassette 18. A not shown translation then makes it possible to deposit said tenth and eleventh articles 71, 72 on the two first racks of the intermediate cassette 18. As illustrated by the two arrows, a similar operation can be carried out in order to again place the first and second articles 20 on the tenth and eleventh racks left free in the storage cassette 18. This operation can take place by translation and lowering of the gripping means 70.

FIG. 8A, control means 90 are shown outside the gripping means, in order to minimize the overall dimensions of the gripping means 70. They also permit a remote control of the complete apparatus according to the invention.

In all the cases shown, the racks of the gripping means and the intermediate cassettes must have the same vertical distance between centers E equal to that of the racks of the cassette for which they are to be used.

In the variant vertical translation means, it is possible to use the intermediate cassette as a true buffer storage means. To achieve this objective, it is merely necessary to give said intermediate cassette an adequate number M of supplementary racks. The vertical and horizontal translation means are conventional mechanical means.

The constructions described hereinbefore serve to explain the inventive concept consisting of using an intermediate cassette for facilitating the storage of flat articles therein and optionally the handling of the said articles. However, one skilled in the art could modify the form of the intermediate cassette or the gripping means, while still respecting the functions attributed to these two main assemblies of the apparatus according to the invention.

I claim:

1. An apparatus for placing or storing flat articles (20) in a storage cassette (18) and which are stored parallel to one another, placed on lateral supports (23) with a predetermined number (N) of racks and separated from one another by a predetermined clearance (E) comprising a gripping means (50,70) having the same number (N) of horizontal tracks (2) separated from one another by the same predetermined clearance (E) and each terminated by a gripping end (6), wherein are positioned means for the gripping and releasing of a flat article (20) with respect to a corresponding rack of the storage cassette (18); an intermediate cassette (60,80) for temporarily holding one or several articles (20) which must be stored again in the storage cassettes having a second number (M) of horizontal racks, equal to or greater than the first number (N) of racks of the storage cassette (18) and which are spaced from one another by said clearance (E) in order to receive the flat articles (20,21,22,25); and a relative horizontal translation between the gripping means (50,70) and the intermediate cassette (60,80) in order to obtain an interpenetration of the gripping means (50) in the intermediate cassette (60) taking place by means of recesses (65) to the rear of each of the tracks (2) of the gripping means (50), in order to enable the intermediate cassette (60) to penetrate the gripping means (50) from the rear and up to a mobile part (4) of the track, permitting the transfer in both directions of at least one flat article (20) between the gripping means (50,70) and the intermediate cassette (60,80).

2. An apparatus according to claim 1, wherein the gripping and releasing means for a flat article (20) functions by raising the mobile part (4) of the corresponding track (2), releasing of the article (20) taking place by lowering said mobile part (4) of the track (2).

3. An apparatus according to claim 2, wherein gripping means (50,70) are each constituted by a deformable bellows (30), said bellows (30) being fixed to the track (2) by a first lower end (32) and to the mobile part (4) by a second upper end (34) and connected to a vacuum source (51).

4. An apparatus according to claim 2, wherein each rack of the cassette (18) includes two lateral supports (23), said lateral supports having a space therebetween to permit the interpenetration of the corresponding track of the gripping means (50,70) by translation parallel to the lateral supports (23), the upper surface of the mobile part (4) being located slightly below the upper surface of the lateral supports (23) of the corresponding stage of the cassette (18), the vertical travel (H) of the mobile part (4), during raising, being adequate to disengage a flat article (20) from the lateral supports of the cassette (18) and, during lowering of the mobile part (4), being adequate to deposit the flat article (20) on the lateral supports of the cassette (18).

5. Apparatus according to claim 1, characterized in that it comprises selective control means (90) for actuating independently of one another the gripping and release means, in order to seize or set down any random flat article (20) placed in the storage cassette (18) or on the intermediate cassette (60,80), or placed on a track (2) of the gripping means (50,70).

6. An apparatus according to claim 2, wherein each rack of the intermediate cassette (60,80) includes two lateral arms (66), said lateral arms having a space therebetween to permit the interpenetration of the corresponding track of the gripping means (50,70) by translation parallel to the lateral arms (66), the upper surface of the mobile part (4) being located slightly below the upper surface of the lateral arms (66) of the corresponding stage of the intermediate cassette (60,80), the vertical travel (H) of the mobile part (4), during raising, being adequate to disengage a flat article (20) from the lateral arms of the intermediate cassette (60,80) and, during lowering of the mobile part (4), being adequate to deposit the flat article (20) on the lateral arms of the intermediate cassette (60,80).

7. Apparatus according to claim 4, characterized in that the interpenetration of the gripping means (70) in the intermediate cassette (80) takes place by the front of the tracks (2), whose width is less than the width of the free space between the lateral supports of the storage cassette (18) and the intermediate cassette (80), so as to be able to traverse said two cassettes (18) and (80) in the same translation movement.

8. Apparatus according to claim 7, characterized in that the vertical translation means of the gripping means (70) serve to bring about a displaced correspondence between the respective racks of the intermediate cassette (80) and the gripping means (70).

9. Apparatus according to claim 4, characterized in that the vertical translation means of the intermediate cassette (60) serve to bring about a displaced correspondence of the respective racks of the intermediate cassette (60) and the gripping means (50).

10. Apparatus according to claim 9, characterized in that the second number (M) of racks of the intermediate cassette (60) exceeds the first number (N) of tracks (2) of the gripping means (50) in order to constitute a buffer storage means.

* * * * *